US009786677B1

(12) United States Patent
Khoueir et al.

(10) Patent No.: US 9,786,677 B1
(45) Date of Patent: Oct. 10, 2017

(54) MEMORY DEVICE HAVING MEMORY CELLS CONNECTED IN PARALLEL TO COMMON SOURCE AND DRAIN AND METHOD OF FABRICATION

(71) Applicant: Seagate Technology LLC, Cupertino, CA (US)

(72) Inventors: Antoine Khoueir, Edina, MN (US); Frank R Dropps, Maple Grove, MN (US)

(73) Assignee: SEAGATE TECHNOLOGY LLC, Cupertino, CA (US)

( * ) Notice: Subject to any disclaimer, the term of this patent is extended or adjusted under 35 U.S.C. 154(b) by 0 days.

(21) Appl. No.: 14/552,191

(22) Filed: Nov. 24, 2014

(51) Int. Cl.
| | |
|---|---|
| H01L 29/788 | (2006.01) |
| H01L 27/11582 | (2017.01) |
| H01L 27/11556 | (2017.01) |
| H01L 29/792 | (2006.01) |
| H01L 21/762 | (2006.01) |
| H01L 21/311 | (2006.01) |
| H01L 21/28 | (2006.01) |

(52) U.S. Cl.
CPC .. *H01L 27/11582* (2013.01); *H01L 21/28273* (2013.01); *H01L 21/28282* (2013.01); *H01L 21/31111* (2013.01); *H01L 21/76224* (2013.01); *H01L 27/11556* (2013.01); *H01L 29/7883* (2013.01); *H01L 29/7926* (2013.01)

(58) Field of Classification Search
CPC ......... H01L 27/11582; H01L 27/11556; H01L 29/7883; H01L 29/7926
See application file for complete search history.

(56) References Cited

U.S. PATENT DOCUMENTS

| | | | |
|---|---|---|---|
| 6,689,658 B2 | 2/2004 | Wu | |
| 8,630,114 B2 | 1/2014 | Lue | |
| 2003/0045082 A1* | 3/2003 | Eldridge | ........... H01L 21/28273 438/593 |
| 2010/0123180 A1* | 5/2010 | Takano | ............. H01L 27/11521 257/324 |
| 2015/0255166 A1* | 9/2015 | Tseng | ..................... G11C 16/28 365/185.17 |

* cited by examiner

*Primary Examiner* — Dale E Page
*Assistant Examiner* — Wasiul Haider
(74) *Attorney, Agent, or Firm* — Cesari & Reed, LLP; Kirk A. Cesari; Logan Brown

(57) ABSTRACT

A memory device may include a memory unit having multiple channel structures connected to a common source and drain in parallel. The memory unit can include floating gate structures including control gates connected to word lines and charge trap layers to store charge to form tiered floating gate memory cells. In some embodiments, rows and columns of memory units can be connected to form a three dimensional memory device. A method of fabricating a memory unit having tiered channel structures utilizing common source and drain elements and 3D memory device utilizing rows and columns of memory units having multiple channel structures connected to the common source and drain elements in parallel is disclosed.

12 Claims, 13 Drawing Sheets

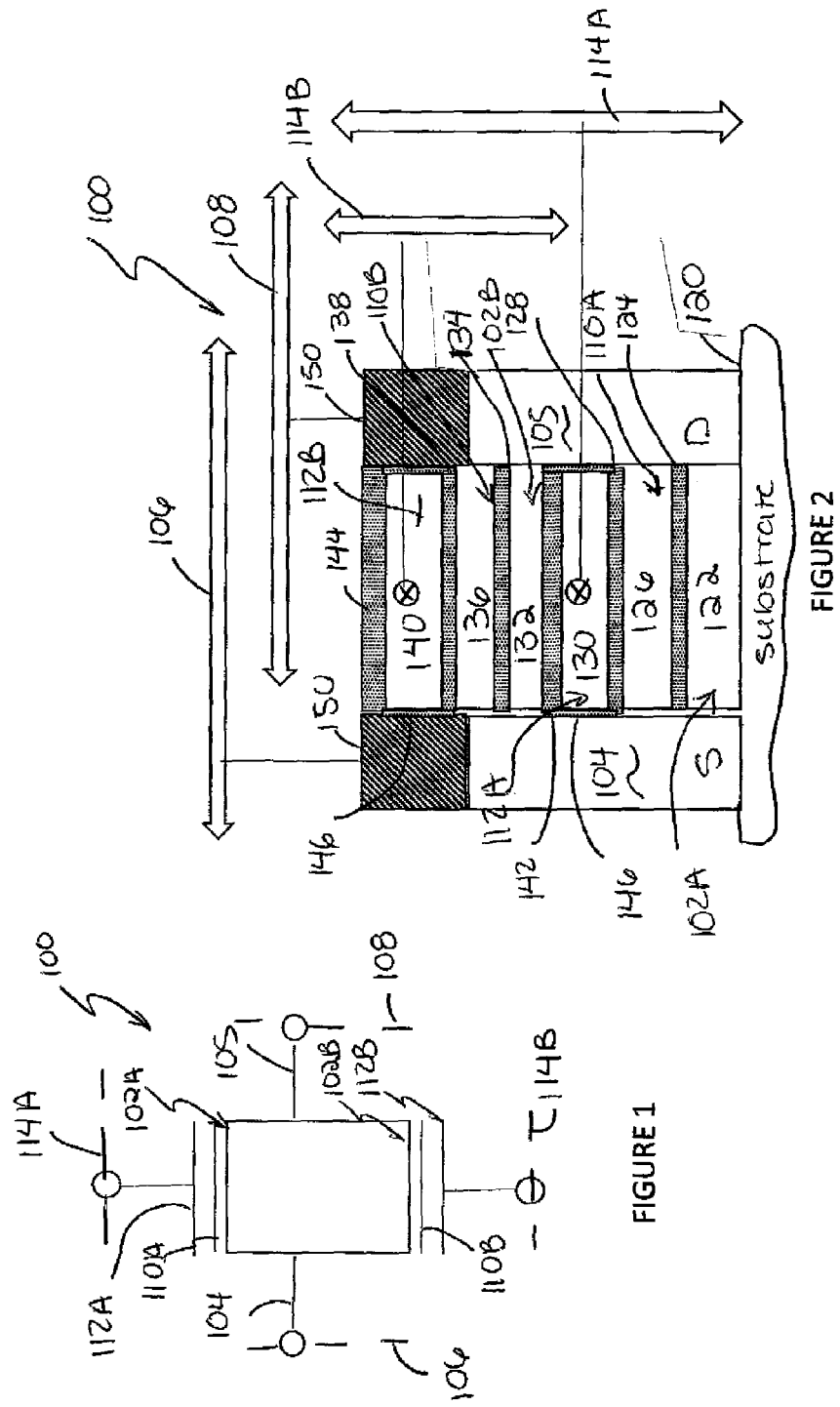

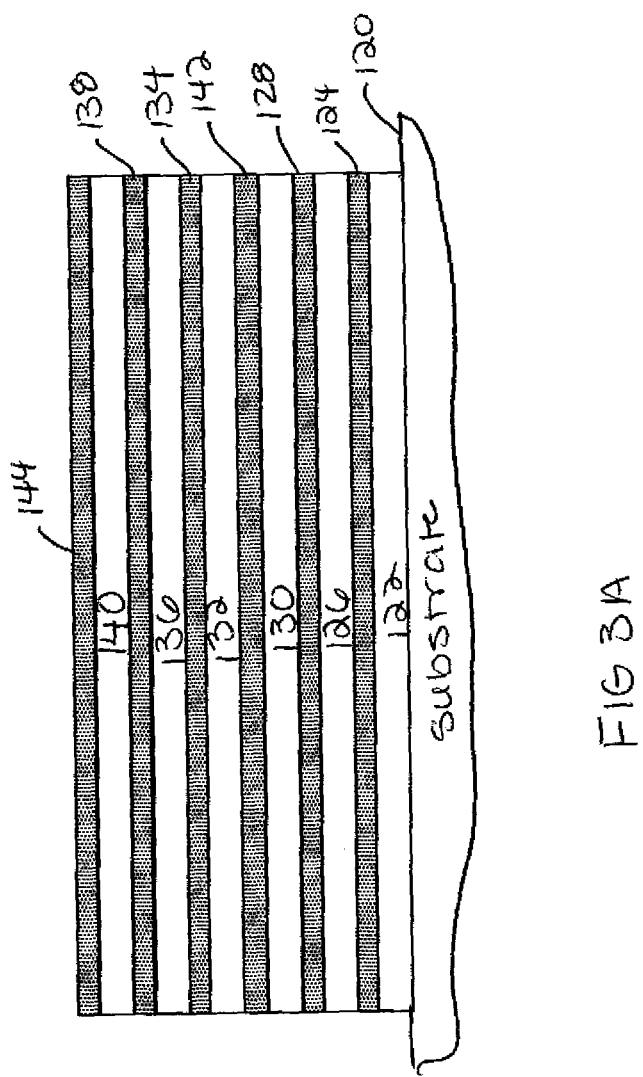

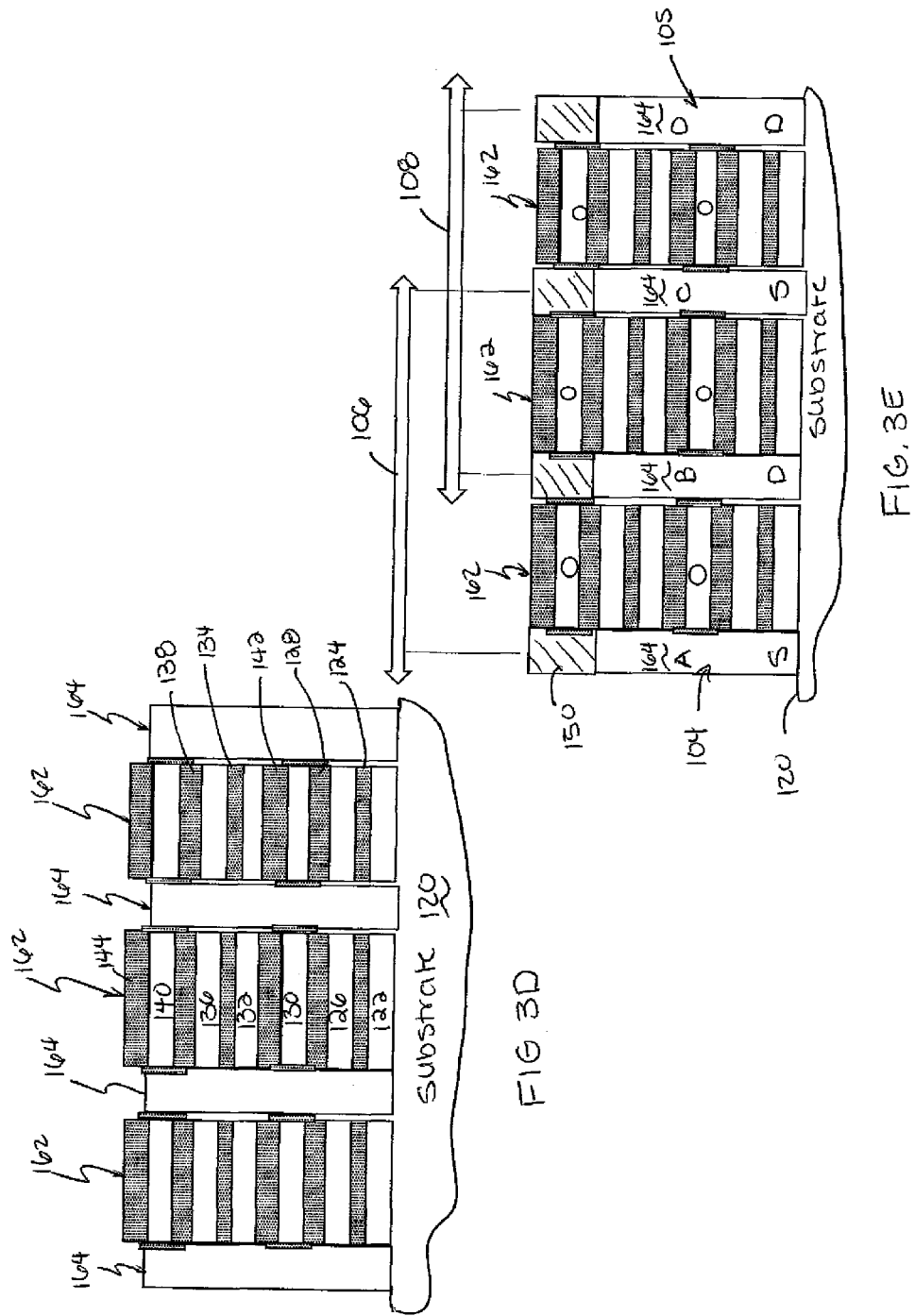

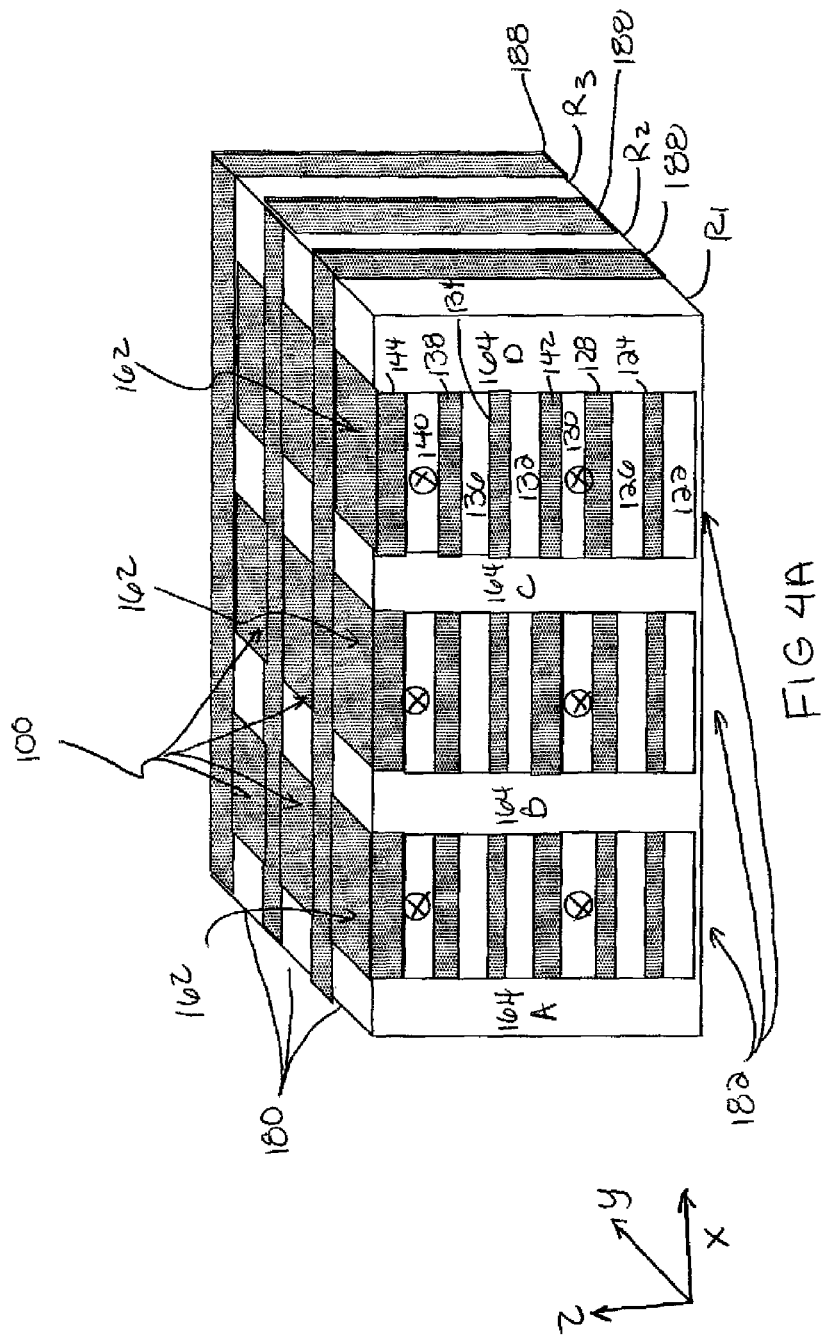

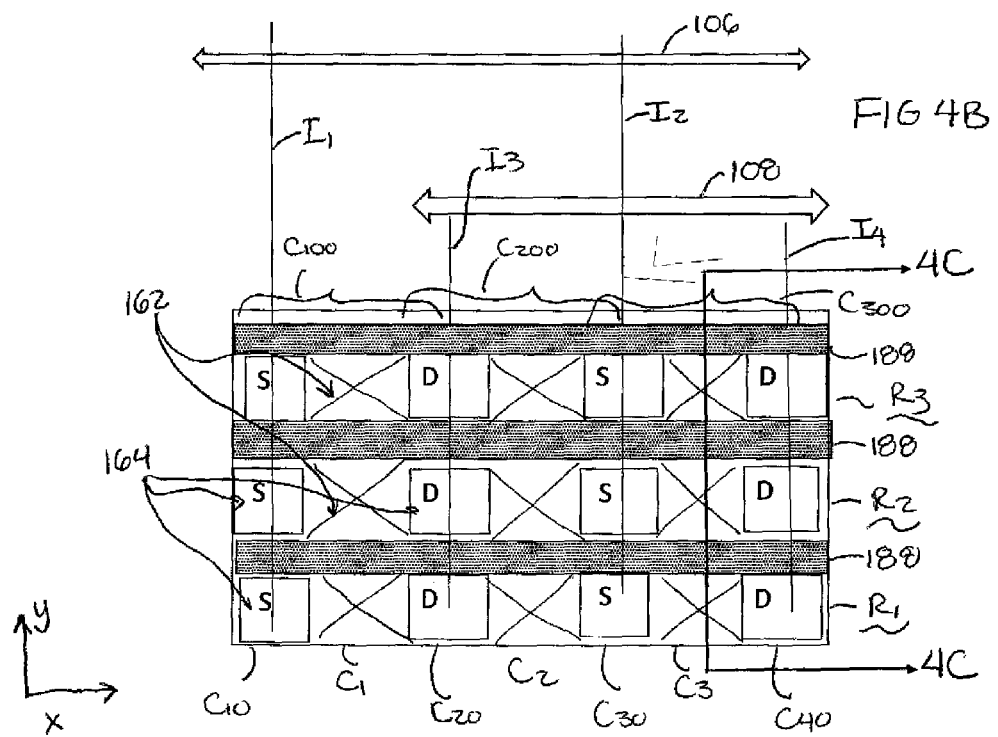
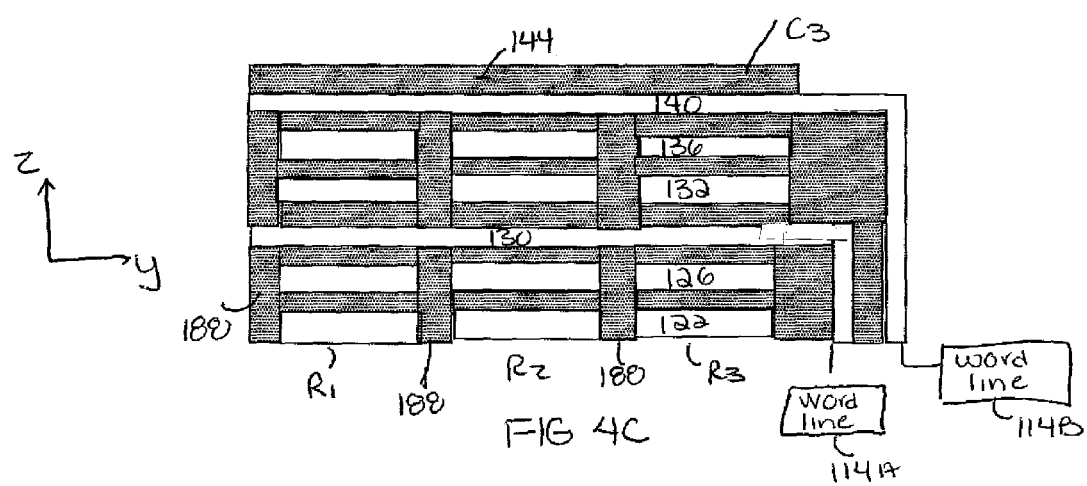

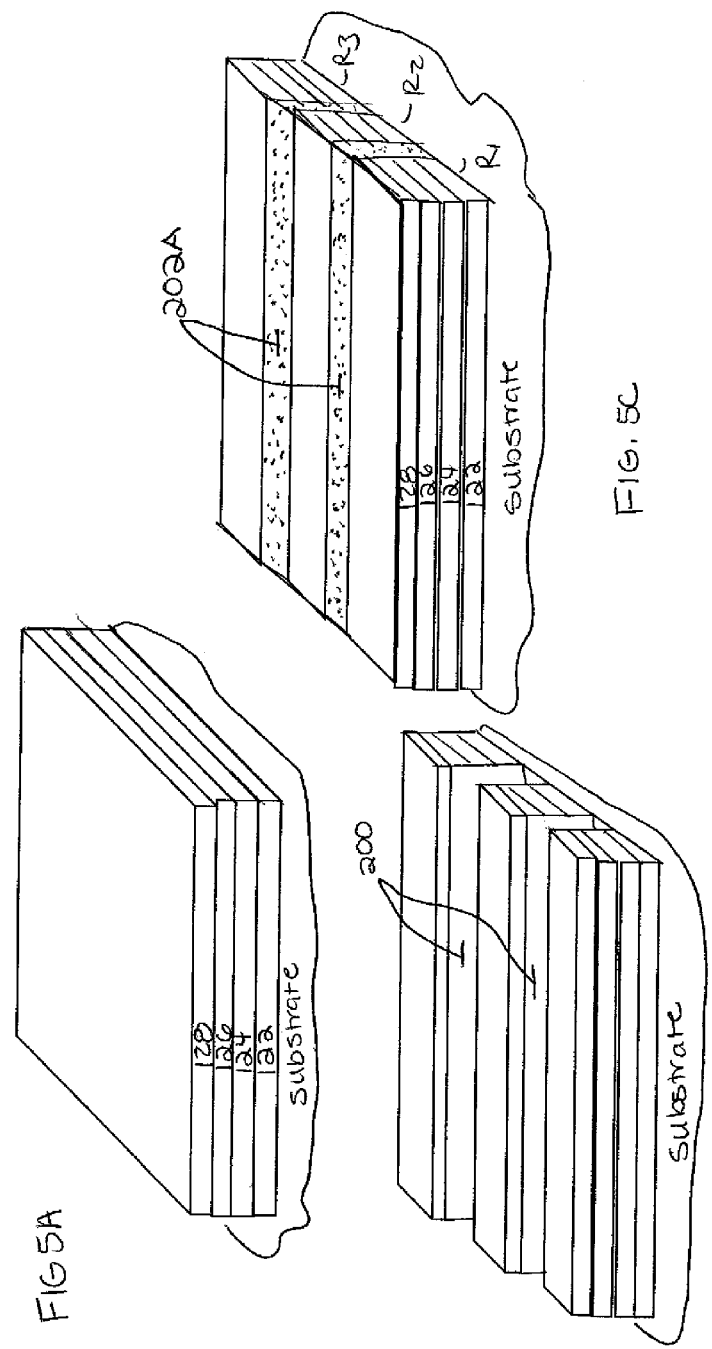

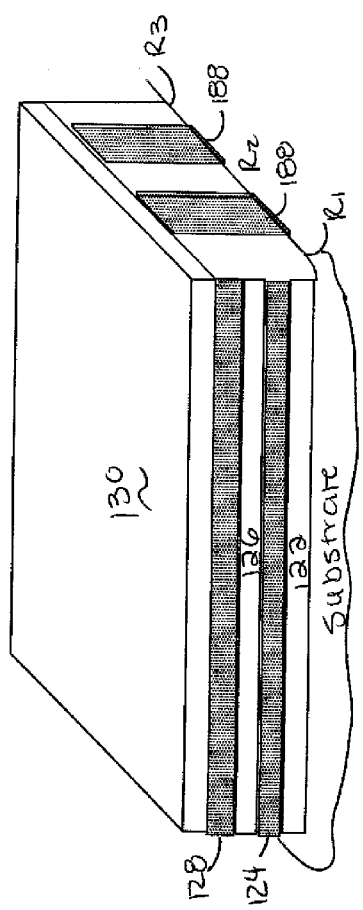
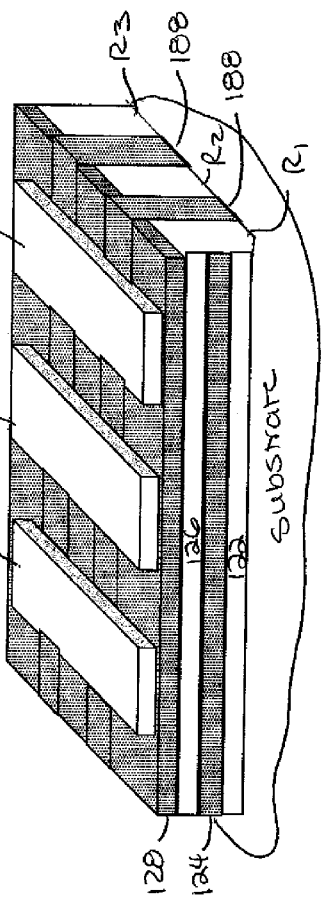

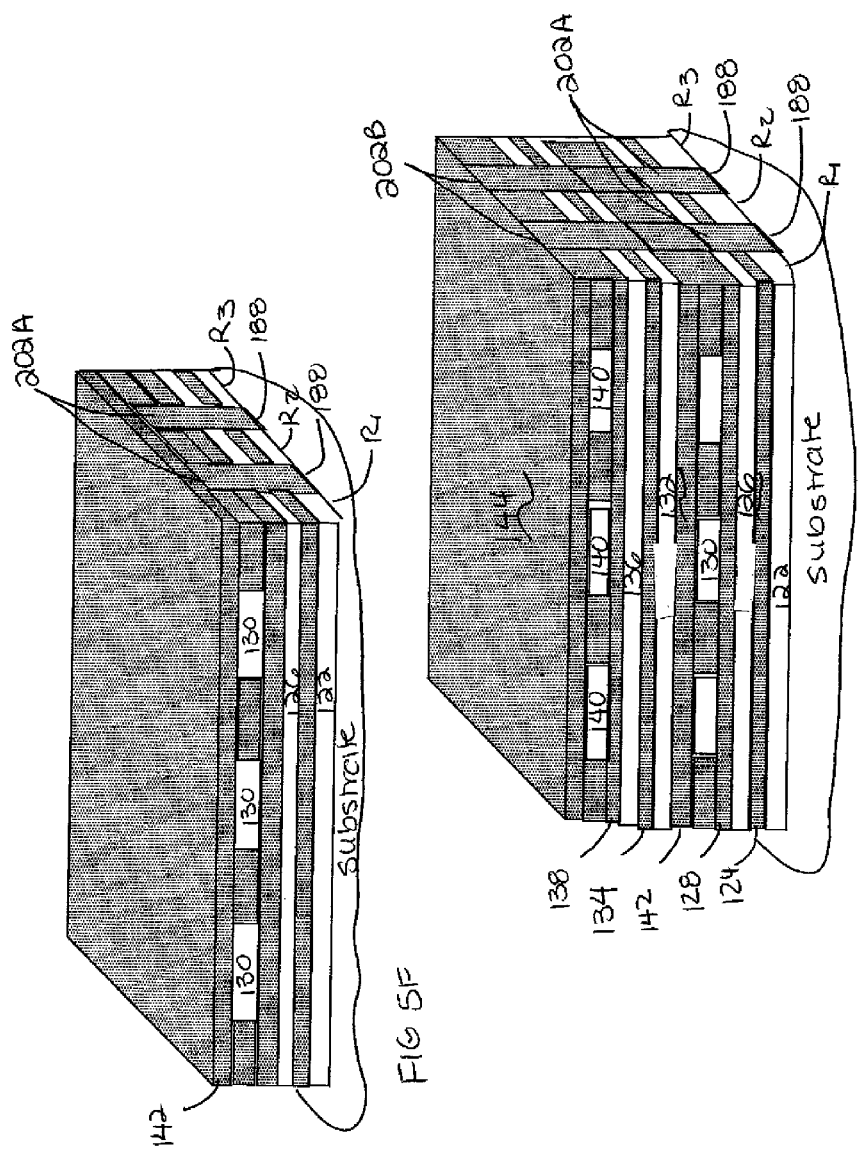

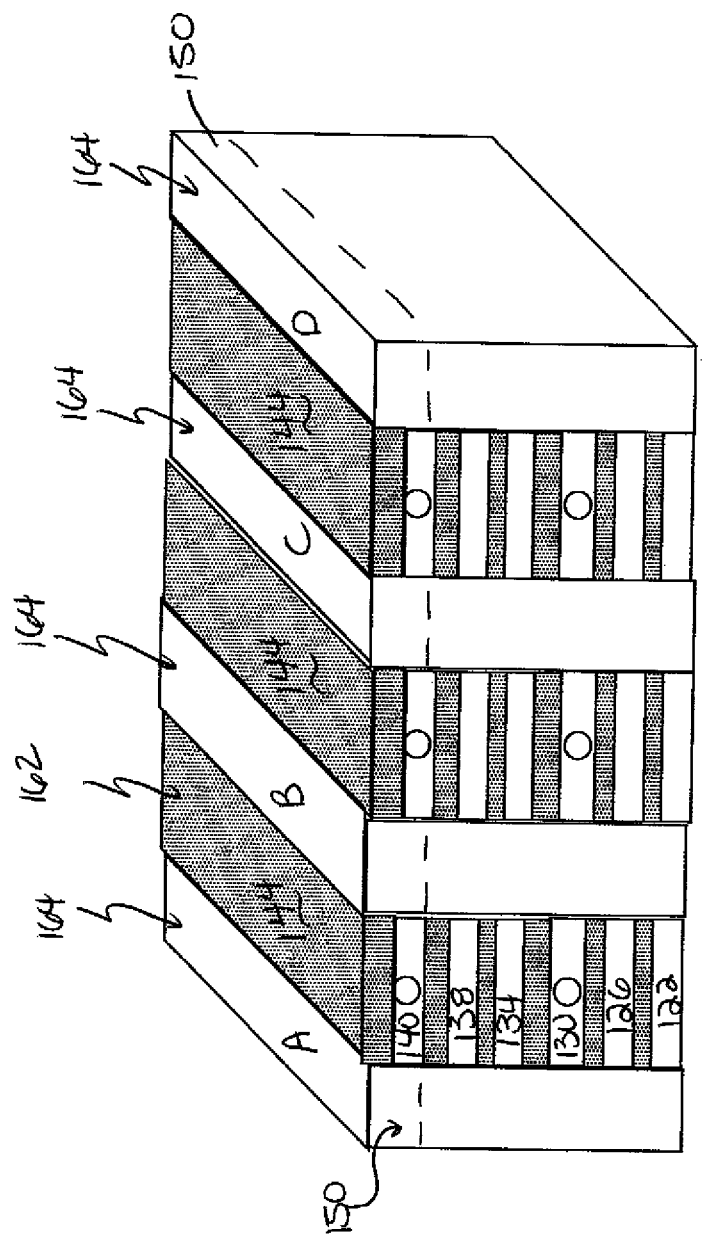

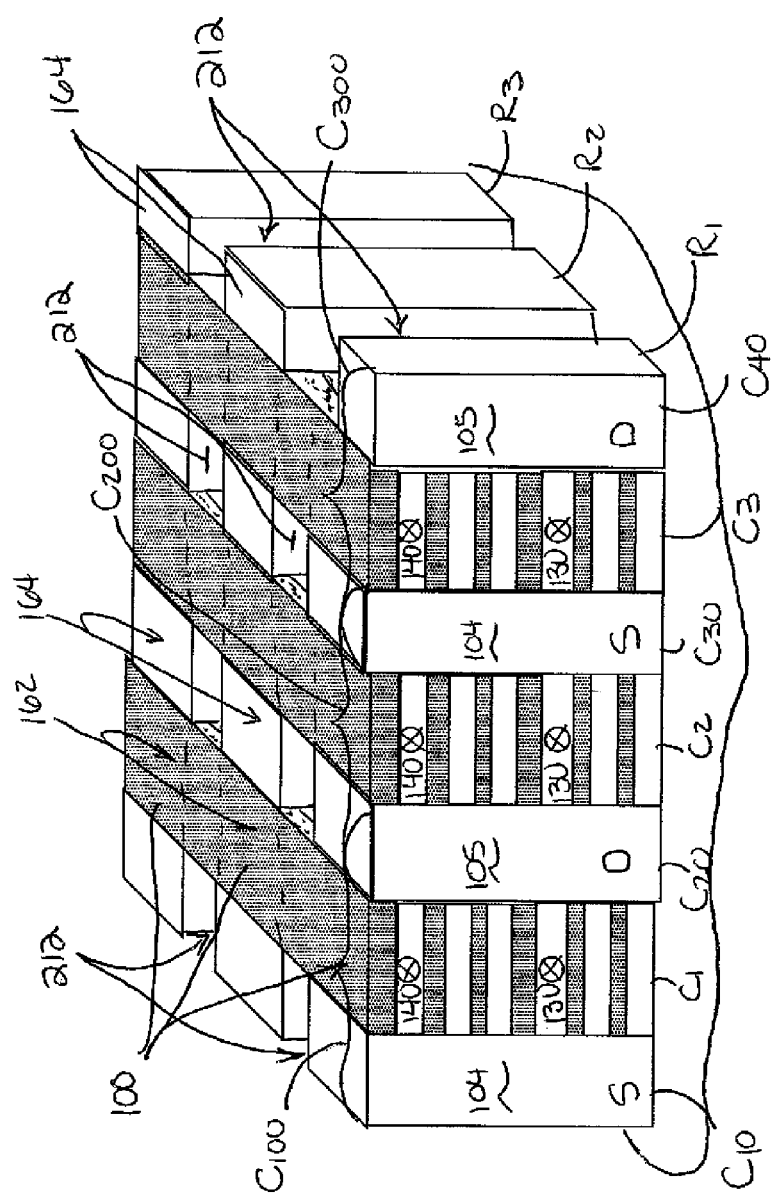

MEMORY DEVICE HAVING MEMORY CELLS CONNECTED IN PARALLEL TO COMMON SOURCE AND DRAIN AND METHOD OF FABRICATION

SUMMARY

The application relates to a memory device including first and second channel structures connected in parallel to a source element and a drain element to form memory cells of a memory unit sharing the common source and drain element.

In certain embodiments, the memory units can be used to form three dimensional 3D memory devices having rows and columns of source and drain elements connected in parallel to tiered channel structures of the memory units.

The application also relates to a method of fabricating a memory unit including tiered memory cells having common source and drain elements. In certain embodiments, the application discloses fabrication of a 3D memory device utilizing rows and columns of the memory units having the common source and drain elements for the tiered channel structures.

BRIEF DESCRIPTION OF THE DRAWINGS

FIG. 1 is a schematic illustration of a memory device including multiple memory cells utilizing a common source and drain, in accordance with certain embodiments of the present disclosure;

FIG. 2 is a cross-sectional illustration of a layered structure of a memory unit including multiple memory cells having a common source and drain, in accordance with certain embodiments of the present disclosure;

FIGS. 3A-3E illustrate progressive process steps for fabricating a memory device including memory units having multiple memory cells utilizing a common source and drain, in accordance with certain embodiments of the present disclosure;

FIG. 4A is a schematic illustration of a three dimensional 3D memory device including memory units having multiple memory cells utilizing a common source and drain, in accordance with certain embodiments of the present disclosure;

FIG. 4B is a plan view of rows and columns of memory units coupled to bit and source lines of logic circuitry to form the 3D memory device, in accordance with certain embodiments of the present disclosure;

FIG. 4C is a cross-sectional view as taken along line 4C-4C of FIG. 4B illustrating control gates of tiered memory cells coupled to words lines of logic circuitry, in accordance with certain embodiments of the present disclosure; and FIGS. 5A-5J illustrate progressive process steps for fabricating a 3D memory device including memory units having tiered memory cells utilizing a common source and drain, in accordance with certain embodiments of the present disclosure.

DETAILED DESCRIPTION

Figure 3B:
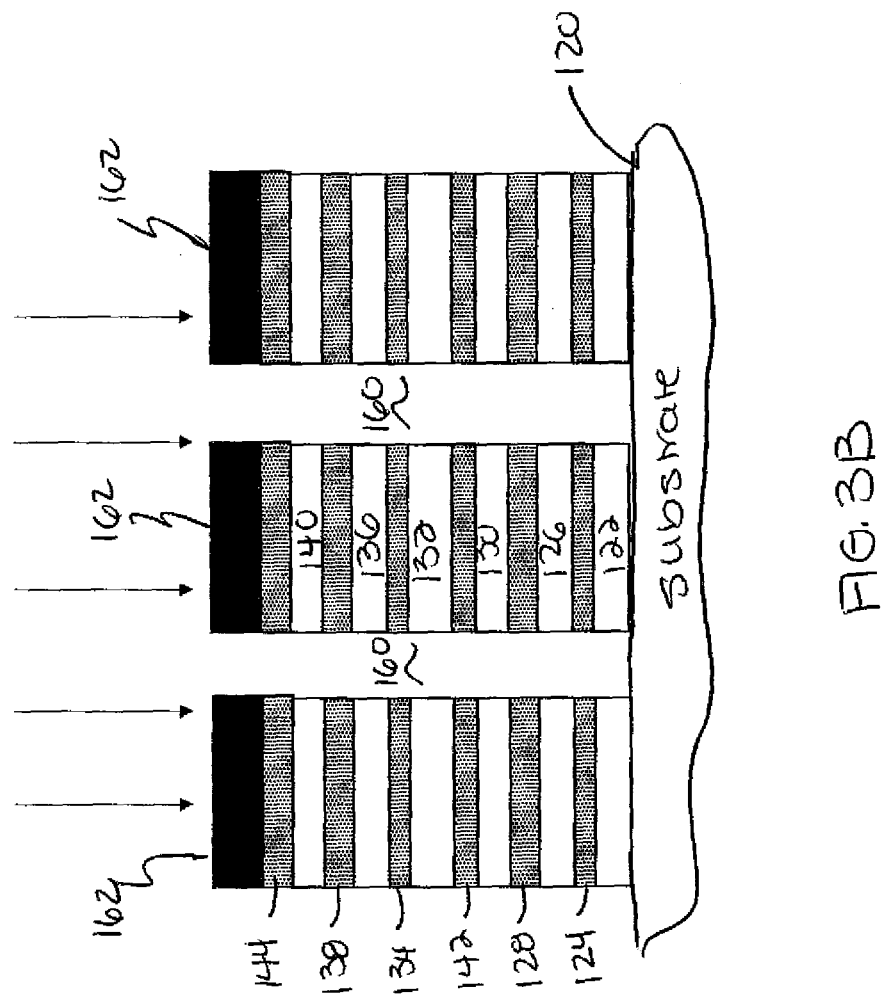
Figure 3C:
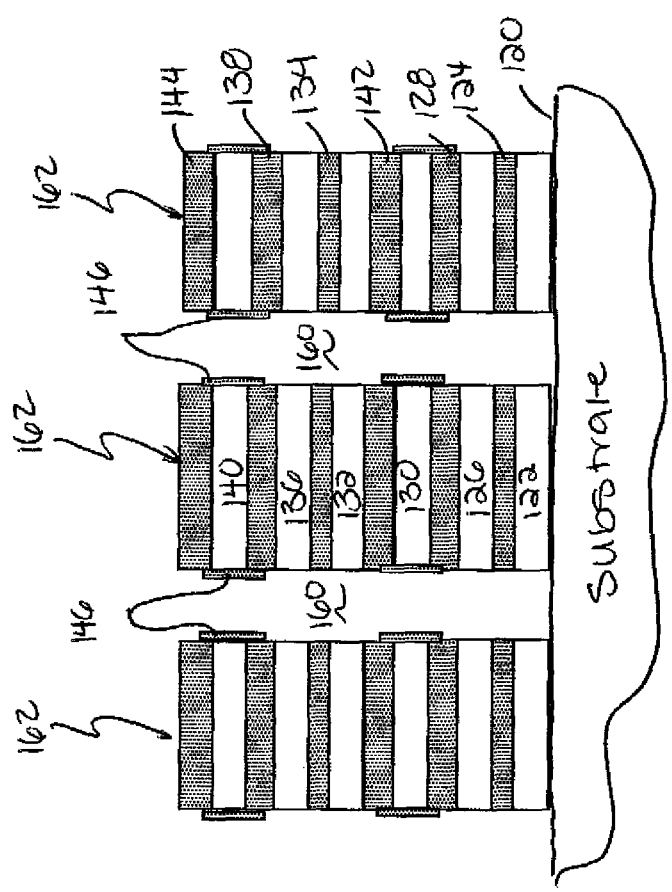

In the following detailed description of the embodiments, reference is made to the accompanying drawings which form a part hereof, and in which are shown by way of illustrations. It is to be understood that features of the various described embodiments may be combined, other embodiments may be utilized, and structural changes may be made without departing from the scope of the present disclosure. It is also to be understood that features of the various embodiments and examples herein can be combined, exchanged, or removed without departing from the scope of the present disclosure.

In accordance with various embodiments, the memory described herein may be used in conjunction with one or more software programs running on a computer processor or controller. Dedicated hardware implementations including, but not limited to, application specific integrated circuits, programmable logic arrays, and other hardware devices can likewise be constructed to implement the methods and functions described herein.

Generally this application relates to a multiple cell memory unit for flash memory storage. Certain embodiments described herein have application for 3D NOR flash memory for providing increased data storage capacity. FIG. 1 is a schematic of the multiple cell memory unit 100 for storing data according to certain embodiments of the present application. The memory unit 100 can include first and second channel structures 102A, 102B, which may be coupled to a common source element 104 and common drain element 105 to form the multiple memory cells of the memory unit 100.

As schematically shown the common source element 104 may be coupled to a source line 106 and the drain element 105 may be coupled to a bit line 108 to connect the source element 104 and the drain element 105 to logic circuitry. In some embodiments, the memory unit may be a floating gate memory unit including floating gates 110A, 110B and control gates 112A, 112B to form multiple floating gate memory cells. The floating gates 110A, 110B can be coupled to the first and second channel structures 102A, 102B to store charge. A voltage can be applied across the channels through source line 106 and bit line 108 and to selected control gates via word lines 114A, 114B to read data from or write data to the memory cells of the memory unit 100.

FIG. 2 illustrates a multiple layered structure forming tiered memory cells of embodiments of the memory unit 100 shown in FIG. 1. The multiple layered structure can be deposited on a substrate 120 and can include multiple layers for the first memory cell and multiple layers for the second memory cell. The layers of the first memory cell include a semiconductor layer 122 forming the first memory channel, a thin tunneling layer 124, a charge trap or floating gate layer(s) 126, an insulating layer 128 and a control gate layer 130 forming the floating and control gates 110A, 112A of the first memory cell. The layers of the second memory cell similarly can include a semiconductor layer 132 for the second memory channel, a tunneling layer 134, a charge trap or floating gate layer(s) 136, insulating layer 138 and a control gate layer 140 forming the floating and control gates 110B, 112B of the second memory cell. The multiple layers of the second memory cell can be deposited on top of the multiple layers of the first memory cell to form a tiered memory structure. As shown a dielectric layer 142 separates the layers of the first memory cell from the layers of the second memory cell and a top insulating layer 144 can be deposited on the tiered memory structure.

The source and drain elements 104, 105 of the memory unit can be formed along opposed sides of the multiple layered structure to abut the channel layers 122, 132 of first and second channel structures 102A, 102B. The source and drain elements 104, 105 as shown connect to the first and second channel layers 122, 132 in parallel to provide the common source and drain elements 104, 105 for the memory unit 100. As schematically shown in FIG. 2, dielectric barriers 146 isolates the control gate layers 130, 140 of the first and second memory cells from the source and drain elements 104, 105 to prevent a short between the control gate layers 130, 140 and the source and drain elements 104, 105.

As shown in FIG. 2, the semiconductor channel layers 122, 132 and source and drain elements 104, 105 can be formed of a doped silicon material. The channel may be P+ type doped silicon layer and the source and drain elements 104, 105 can be N-type doped material to form an N-P-N transistor junction. The tunneling dielectric layers 124, 134 separate the channel layers 122, 132 from the charge trap layers 126, 136 of the floating gate structures 110A, 110B and insulating layers 128, 138 separate the control gate layers 130, 140 from the charge trap layers 126, 136 to store charge on the floating gates 110A, 110B. The tunneling dielectric layers 124, 134 can be formed of a thermal oxide layer.

The floating gate layers 126, 136 can be fabricated of a doped polycrystalline-silicon or amorphous silicon material. The dielectric layers 128, 138 can be fabricated of a silicon-oxide/silicon-nitride or silicon-oxide (ONO) or silicon-nitride/silicon-oxide. The control gate layers 130, 140 can be a metal doped polysilicon. The memory cells can be programmed and erased utilizing known techniques such as channel hot electron injection and Fowler-Nordheim tunneling to store and erase charges on the floating gate or charge storage layers 126, 136 to write and erase data to the memory cells. Voltage can be applied to the source and drain elements 104, 105 to determine the charge state of the floating gate or charge storage layer 126, 136 to read data from the memory cells.

As shown in FIG. 2, the memory unit 100 can include conductive contact plugs 150 to connect the source and drain elements 104, 105 to the source line 106 and drain line 108 of the logic circuitry (not shown). As shown, the control gates or layers 130, 140 of the memory cells connect to word lines 114A, 114B to selectively apply a voltage to the gates 130, 140 to read data from the tiered memory cells of the memory units 100 as shown in FIG. 3E. Although, the memory structure in FIG. 2 illustrates two memory cells utilizing the common source and drain, application is not limited to two memory cell tiers and the memory unit can include any number of memory cells connected to the common source and drain elements in parallel.

FIGS. 3A-3E illustrate progressive process steps for fabricating embodiments of the memory unit 100 previously described. As shown in FIG. 3A, the multiple layers of the first and second memory cells can be deposited on the substrate 120. The substrate 120 may be a silicon substrate and the deposited layers of the first memory cell include the channel layer 122, thin dielectric tunneling layer 124, charge trap layer 126, insulating layer 128 and control gate layer 130. As shown, the insulating layer 142 between the tiered memory cells can be deposited on the control gate layer 130. The channel layer 132, tunneling layer 134, charge trap layer 136, insulating layer 138 and control gate layer 140 of the second memory cell or tier can be deposited on the insulating layer 142. The top insulating layer 144 can be deposited on the second control gate layer 140 to form the multiple tiered structure as shown.

As shown in FIG. 3B, a plurality of trenches 160 can be etched in the multiple layer structure to form tiered memory blocks 162 for multiple memory units 100. The trenches 160 can be formed using known masking and etching techniques such as photolithography masking and etching techniques. As show in FIG. 3C, the control gate layers 130, 140 of the tiered memory blocks 162 can be oxidized to form insulating barriers 146 to electrically isolate the control gates 130, 140. As shown in FIG. 3D, the trenches 160 can be filled with a doped semiconductor material to form semiconductor blocks 164 along opposed sides of the tiered memory blocks 162 connected to the channel layers 122, 132 in parallel. The semiconductor blocks 164 can be a doped polysilicon N+ to form the source and drain elements 104, 105 of the tiered memory cells. As shown in FIG. 3E, conductive metal plug 150 can be deposited on the semiconductor blocks 164 to electrically connect the semiconductor blocks 164 to source and bits lines 106, 108 to form the source and drain elements 104, 105 for the memory cells of the memory unit 100. In some embodiments, blocks 164A, 164C can be connected to the source line 106 to form the source elements 104 and blocks 164B, 164D can be connected to bit line 108 to form the drain elements 105 of the memory units 100.

The memory units 100 including the multiple tiered memory cells have application for forming a 3D memory array or device in accordance with certain embodiments of the application as shown in FIG. 4A. The 3D memory device can include multiple rows 180 and columns 182 of the memory units 100. The columns 182 of memory units 100 can be spaced along a x dimension and the rows 180 of memory units 100 can be spaced along the y axis to form the 3D array of memory cells where the multiple tiers of the memory units 100 corresponds to a z dimension. Each memory unit 100 of the 3D memory device shown can include the tiered memory blocks 162 and the semiconductor blocks 164 forming the memory units 100 as previously described. As shown in FIG. 4A, insulating blocks 188 separate the rows 180 of tiered memory blocks 162 and semiconductor blocks 164 to form the 3D memory device.

FIG. 4B is a top plan view illustrating rows $R_1$, $R_2$, $R_3$ and columns $C_1$, $C_2$, $C_3$ of the memory blocks 162 connected to rows $R_1$, $R_2$, $R_3$ and columns $C_{10}$, $C_{20}$, $C_{30}$ $C_{40}$ of semiconductor blocks 164 to form the rows 180 and columns 182 of memory units 100. As shown, the columns $C_{10}$, $C_{30}$, of semiconductor blocks 164 can be connected to source lines 106 via interconnects $I_1$, $I_2$ to form source elements 104 and the columns $C_{20}$, $C_{40}$ of semiconductor blocks 164 can be connected to bit lines 108 via interconnects $I_3$, $I_4$ to form drain elements 105. As shown, the tiered memory blocks 162 of columns $C_1$ and $C_2$ share the drain elements of column $C_{20}$, and the tiered memory blocks 162 of columns $C_2$ and $C_3$ share source elements of column $C_{30}$ to form the columns $C_{100}$, $C_{200}$, $C_{300}$ of memory units 100 of the 3D memory device. Thus, in some embodiments four channel layers 122, 132 of the memory blocks 162 of columns $C_1$ and $C_2$, can be connected in parallel to the semiconductor blocks 164 of column $C_{20}$ and the channel layers 122, 132 of memory blocks of columns $C_2$ and $C_3$ can be connected in parallel to the semiconductor blocks 164 of $C_{30}$.

The control gate layers 130, 140 of tiered memory blocks 162 can be connected to word lines 114A, 114B to form multiple memory cells tiers in the z dimension. In embodiments shown in FIG. 4C, the control gates 130 of column $C_3$ of the first memory tier can be connected to first word line 114A and the control gates 140 of column $C_3$ of the second memory tier can be connected to second word line 114B. The control gates 130 of the first memory tier of column $C_2$ can be connected to a third word line, and the control gates 140 of the second memory tier of $C_2$ can be connected to a forth word line, not shown in FIG. 4C. Thus, each column of memory units may include multiple address blocks formed via the multiple memory tiers of the memory units. In particular, in the embodiments shown, the first tier of memory cells along column $C_{300}$ form a first address block and the second tier of memory cells along column $C_{300}$ form a second address block for read and write operations.

Figure 5H:
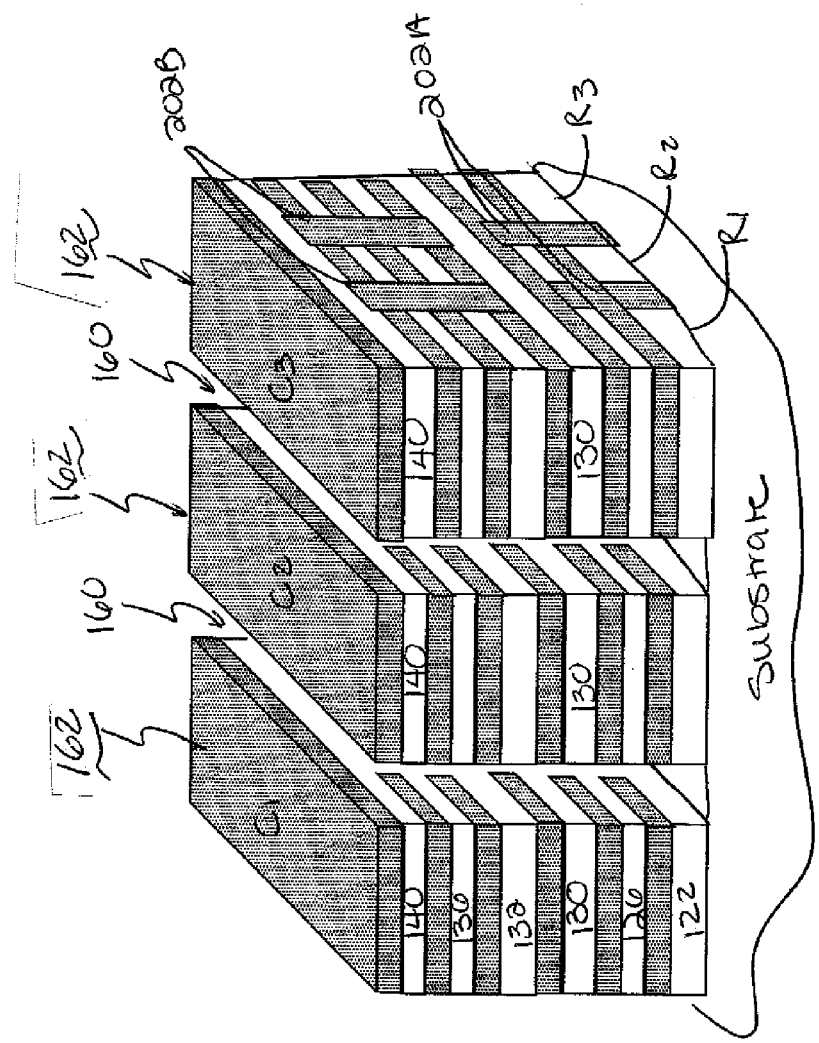

FIGS. 5A-5K illustrate progressive process steps for forming a 3D memory device include rows 180 and columns 182 of memory units 100 as previously described. As shown in FIG. 5A, semiconductor layers can be deposited on a substrate 120 to form the first channel layer 122, the tunnel oxide layer 124, the charge trap layer 126 and insulating layer 128 of the first memory tier. As shown in FIG. 5B, isolations trenches 200 can be etched in the deposited layers and as shown in FIG. 5C the isolation trenches 200 can be filled with the insulating material to form the rows $R_1$, $R_2$, $R_3$ of memory cells for the first memory tier separated via insulating blocks 202A.

As shown in FIG. 5D, the control gate layer 130 can be deposited on the deposition layers to form the control gates 112A for the first tier of memory cells. As shown in the process steps illustrated in FIG. 5E the control gate layer 130 can be etched to form control gate columns 204 for the first memory tier. Insulating layer 142 can be deposited in the etched areas to form the insulating layer 142 separating the memory cell tiers and the control gate columns 204 as shown in FIG. 5F. As shown in FIG. 5G, the process steps can be repeated to deposit the layers of the second memory cell tier including the second channel layer 132, the tunnel oxide layer 134, the charge trap 136 and insulating layer 138, control gate layer 140 and insulating layer 144 as shown in FIG. 5G. The layers can be etched as previously described for the first memory tier to form the insulating blocks 202B for the second memory tier and the control gates 112B.

As shown in FIG. 5H, trenches 160 can be etched to form the columns $C_1$, $C_2$, $C_3$ of memory blocks 162 including the tiered memory cells and the control gate layers 130, 140 can be oxidized as previously described to form the insulating barrier 148 between the control gates and the source and drain elements 104, 105 fabricated in the trenches 160. As shown in FIG. SI, the trenches 160 can be filled with the semiconductor material to form semiconductor blocks 164 for the source and drain elements. As shown in FIG. SI, the conductive plug 150 can be deposited on the semiconductor material to form electrical contacts for the interconnects $I_1$, $I_2$, $I_3$ and $I_4$ as shown in FIG. 4B. As shown in FIG. 5J, trenches 212 can be etched to form the rows $R_1$, $R_2$, $R_3$ of semiconductor blocks 164 forming the source and drain elements 104, 105 for the rows and columns of tiered memory structures or units 100. The etched trenches 212 between the rows of semiconductor blocks 164 can be filled with an insulating fill to electrically isolate the rows $R_1$, $R_2$, $R_3$ of semiconductor blocks 164 as illustrated in FIG. 5A.

The columns $C_{10}$, $C_{20}$, $C_{30}$ $C_{40}$ of semiconductor blocks 164 can be connected to source and drain lines 104, 105 via contacts 150 to form the memory address blocks previously described. As previously described, the control gates 130, 140 of the multiple tiers can be connected to separate word lines to provide multiple tiered address blocks for each column of memory units as previously described. For example, the first channel structures of a first column $C_1$ form a first address block and the second channel structures of the first column $C_1$ form a second address block. Thus, the number of address blocks correspond to the number of columns of memory units and the number of stacked tiers in each memory unit.

The embodiments and examples described herein provide a flash memory providing additional capacity for NOR flash memory storage. The illustrations, examples, and embodiments described herein are intended to provide a general understanding of the structure of various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Moreover, although specific embodiments have been illustrated and described herein, it should be appreciated that any subsequent arrangement designed to achieve the same or similar purpose may be substituted for the specific embodiments shown.

This disclosure is intended to cover any and all subsequent adaptations or variations of various embodiments. Combinations of the above examples, and other embodiments not specifically described herein, will be apparent to those of skill in the art upon reviewing the description. Additionally, the illustrations are merely representational and may not be drawn to scale. Certain proportions within the illustrations may be exaggerated, while other proportions may be reduced. Accordingly, the disclosure and the figures are to be regarded as illustrative and not restrictive.

What is claimed is:

1. A memory device comprising:
   a three dimensional array of memory cells including a plurality of rows and a plurality of columns of memory units including a plurality of tiered memory cells including tiered channel structures, at least two of the tiered channel structures each being connected in parallel directly to a common source element and directly to a common drain element to form the three dimensional array; and
   the memory device further including rows of semiconductor blocks separated by an insulating structure to form the common source and drain elements for the plurality of rows.

2. The memory device of claim 1 comprising a plurality of rows and columns of semiconductor blocks connected in parallel to rows and columns of the tiered channel structures to form the common source and drain elements of the tiered memory cells.

3. The memory device of claim 2 comprising a first column of the semiconductor blocks are connected to a source line and a second column of the semiconductor blocks are connected to a drain line to form the source and drain elements for a column of memory units.

4. The memory device of claim 1 comprising the tiered memory cells of a memory unit column are coupled to a column of semiconductor blocks connected to a source line and a column of semiconductor blocks connected to a drain line to form the common source and drain element for the column of memory units.

5. A memory device comprising:
   a three dimensional array of memory cells including a plurality of rows and a plurality of columns of memory units including a plurality of tiered memory cells including tiered channel structures, at least two of the tiered channel structures each being connected in parallel directly to a common source element and directly to a common drain element to form the three dimensional array; and
   the tiered memory cells comprise a first memory tier having first tier control gates connected to a first word line and a second memory tier having second tier control gates connected to a second word line.

6. The memory device of claim 5 comprising the tiered memory cells comprises a first column of memory cells having the first tier control gates connected to the first word line and the second tier control gates connected to the second word line and a second column of memory cells including the first tier control gates connected to a third word line and the second tier control gates connected to a fourth word line.

7. The memory device of claim 1 comprising the tiered memory cells include tiered gate structures including a charge trap layer, a tunneling oxide layer and a control gate separated from the charge trap layer via an insulating layer.

8. A memory device comprising:
a memory block including a first channel structure of a first memory cell and a second channel structure of a second memory cell, the first channel structure and second channel structure being directly connected in parallel to a common source element and to a common drain element; and
the memory block further including first and second floating gate structures connected in parallel to the common source and common drain elements.

9. The memory device of claim 8, comprising:
another memory block including a third channel structure of a third memory cell and a fourth channel structure of a fourth memory cell, the first channel structure, the second channel structure, the third channel structure and fourth channel structure being connected to the common source element.

10. The memory device of claim 8, further comprising:
another memory block including a third channel structure of a third memory cell and a fourth channel structure of a fourth memory cell, the first channel structure, the second channel structure, the third channel structure and fourth channel structure being connected the common drain element.

11. The memory device of claim 8, further comprising the first memory cell includes a charge trap layer, a tunneling layer and a control gate.

12. The memory device of claim 8, further comprising a three dimensional array of memory cells including a plurality of rows and a plurality of columns of memory units including a plurality of tiered memory cells, the plurality of tiered memory cells including the memory block.

* * * * *